(12) United States Patent
Nakahata et al.

(10) Patent No.: US 6,465,851 B1
(45) Date of Patent: *Oct. 15, 2002

(54) DRAM DEVICE WITH IMPROVED MEMORY CELL RELIABILITY

(75) Inventors: Takumi Nakahata; Satoshi Yamakawa; Yuji Abe, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 69 days.

(21) Appl. No.: 08/948,260

(22) Filed: Oct. 9, 1997

(30) Foreign Application Priority Data

Apr. 4, 1997 (JP) ............................................. 9-086439

(51) Int. Cl.$^7$ ........................... H01L 29/76; H01L 29/94
(52) U.S. Cl. ...................... 257/382; 257/300; 257/408
(58) Field of Search ............................... 257/296, 297, 257/298, 300, 311, 906, 907, 908, 900, 408, 344, 382, 506, 510, 514; 438/300, 301

(56) References Cited

U.S. PATENT DOCUMENTS

| | | | | |
|---|---|---|---|---|
| 4,885,617 A | * | 12/1989 | Mazure-Espejo et al. | ... 257/384 |
| 5,216,271 A | * | 6/1993 | Takagi et al. | ................ 257/370 |
| 5,319,232 A | * | 6/1994 | Pfiester | ........................ 257/344 |
| 5,371,026 A | * | 12/1994 | Hayden et al. | ............. 438/275 |
| 5,571,733 A | * | 11/1996 | Wu et al. | .................... 438/227 |

FOREIGN PATENT DOCUMENTS

| | | | |
|---|---|---|---|
| JP | 2-143456 | | 6/1990 |
| JP | 6-53491 | * | 2/1994 |

OTHER PUBLICATIONS

"A 0.23um$^2$ Double Self–Aligned Contact Cell for . . . ", H. Koga et al. IEDM Technology Digest, D589, 1996, pp. 1–4.
"Limitations of Selective Epitaxial Growth Conditions . . . ", K. Aketagawa et al., Journal of Crystal Growth III, 1991, pp. 860–863.

* cited by examiner

*Primary Examiner*—Steven Loke
*Assistant Examiner*—Hung Kim Vu
(74) *Attorney, Agent, or Firm*—McDermott, Will & Emery

(57) ABSTRACT

Epitaxial silicon layers are formed on n$^+$-source/drain regions of two MOS transistors neighboring to each other and formed on a silicon substrate, respectively. In this processing, polycrystalline silicon pieces are generated on an element isolating and insulating film and others. Thereafter, the silicon substrate is exposed to an oxygen atmosphere so that hydrogen reacts with silicon at the surfaces of the epitaxial silicon layers and the surfaces of the polycrystalline silicon pieces to form silicon oxide films and polycrystalline silicon pieces. Thereby, short-circuit between MOS transistors in neighboring memory cells is prevented, and a semiconductor device has a high electrical reliability.

2 Claims, 16 Drawing Sheets

DRAM DEVICE WITH IMPROVED MEMORY CELL RELIABILITY

BACKGROUND OF THE INVENTION

1. Field of the Invention

The present invention relates to a semiconductor device and a method of manufacturing the same, and in particular to a semiconductor device for improving a reliability of memory cells in a DRAM (Dynamic Random Access Memory) and a method of manufacturing the same.

2. Description of the Background Art

As shown in FIG. 23, a DRAM has one-transistor and one-capacitor structure including one MOS transistor 27 and one capacitor 28. A voltage equal to or higher than a predetermined threshold voltage is applied to a gate electrode of the MOS transistor so that electric charges are accumulated in or discharged from the capacitor. Through these operations, data is held, written or read.

A conventional method of manufacturing a DRAM will be described below with reference to Japanese Patent Laying-Open No. 2-143456 (1990).

Referring to FIG. 24, an element isolating and insulating film 2 is formed on a silicon substrate 1 by a trench isolating method. Element isolating and insulating film 2 defines a plurality of regions for forming MOS transistors and others on silicon substrate 1. A gate oxide film 3 is formed by a thermal oxidation method. A polycrystalline silicon film 4 and a silicon oxide film 5 are formed. Gate electrode portions 6 are formed by anisotropic etching effected on polycrystalline silicon film 4 and silicon oxide film 5 masked with a predetermined photoresist. Ion implantation is performed to from n⁻source/drain regions 7a, 7b, 7c and 7d.

Referring to FIG. 25, a side wall 8 is formed on a side surface of each gate electrode portion 6. An ion implantation method is performed to form n⁺-source/drain regions 9a, 9b, 9c and 9d. Thereby, source electrode portions 10a and 10b as well as drain electrode portions 11a and 11b are formed.

Referring to FIG. 26, a chemical vapor deposition method or the like is performed to form epitaxial silicon layers 12a and 12b only on source electrode portions 10a and 10b. Epitaxial silicon layers 12c and 12d are formed on only drain electrode portions 11a and 11b. Epitaxial silicon layers 12a, 12b, 12c and 12d thus formed have top surfaces located higher than tops surfaces of silicon oxide films 5 of the gate electrode portions, and protrude over side walls 8 and element isolating and insulating film 2.

Referring to FIG. 27, an insulating film 13a is formed by a chemical vapor deposition method or the like.

Referring to FIG. 28, bit line contacts 14 and bit lines 15 are formed. An insulating film 13b covering bit lines 15 is formed on insulating film 13a. Storage node contacts 16a and 16b as well as storage nodes 17a and 17b are formed. A cell plate 19 is formed on storage nodes 17a and 17b with a high capacity insulating film layer 18 therebetween. Storage node 17a, high capacity insulating film layer 18 and cell plate 19 form one capacitor 20. Thereafter, metal interconnections and others are formed on capacitor 20 with an interlayer insulating film layer therebetween. In the foregoing manner, the semiconductor device is completed.

The above method of manufacturing the semiconductor device suffers from the following problem. First, as shown in FIG. 29, epitaxial silicon layers 12a and 12b are gradually formed only on n⁺-source/drain regions 9b and 9c after the step in FIG. 25, respectively.

As shown in FIG. 30, epitaxial silicon layers 12a and 12b continuously grow over surfaces of element isolating and insulating film 2 and side wall 8. Finally, as shown in FIG. 31, epitaxial silicon layers 12a and 12b cover the entire surface of side wall 8 and a part of the upper surface of element isolating and insulating film 2.

It has been reported in Journal of Crystal Growth 111 (1991), pp. 860–863 that polycrystalline silicon pieces 21 are generated on element isolating and insulating film 2, silicon oxide film 5 and others when the thicknesses of epitaxial silicon layers 12a and 12b exceed a predetermined value.

According to this reference, a material gas of, e.g., $Si_2H_6$ collides with the surface of the silicon oxide film during growth of the epitaxial silicon layer, and a part of the material gas decomposes into adatoms on the surface of the silicon oxide film. When the surface of the silicon oxide film is covered by these adatoms to a certain extent, polycrystalline silicon grows around adatoms serving as nuclei. Thus, the grown polycrystalline silicon changes into polycrystalline silicon pieces.

In typical formation of the epitaxial silicon layer, it can be estimated that this threshold thickness is about 150 nm. Lateral protrusion Gs of about 60 nm occurs at this time as shown in FIG. 31.

In the case of the 1-gigabit DRAM, it is estimated that gate electrode portion 6 has a height Hg of about 200 nm and an element isolating and insulating film 2 has a width Wt of about 200 nm. In this case, a thickness equal to or larger than threshold thickness Ts is required for forming epitaxial silicon layers 12a and 12b.

If film thickness Ts is 200 nm, lateral protrusion Gs is about 80 nm. If the element isolating width is 200 nm, a space Ds of only about 40 nm is left between epitaxial silicon layers 12a and 12b. Polycrystalline silicon pieces 21 are generated on element isolating and insulating film 2 between epitaxial silicon layers 12a and 12b.

If polycrystalline silicon pieces 21 thus generated are in contact with each other and are also in contact with epitaxial silicon layers 12a and 12b (i.e., in the case A), neighboring epitaxial silicon layers 12a and 12b are short-circuited together in this step.

In the other cases including a case B that some of polycrystalline silicon pieces 21 generated in the above step are spaced from the other polycrystalline silicon pieces, neighboring epitaxial silicon layers 12a and 12b are electrically insulated from each other for the time being.

In a next step, insulating film 13a is formed over neighboring epitaxial silicon layers 12a and 12b. Generally, in processing of forming an insulating film covering a portion between two neighboring patterns, the insulating film may not cover the above portion and a so-called void may be formed if a space between the neighboring convex patterns is relatively small. Particularly, in the case of a 1-gigabit DRAM, the epitaxial silicon layer has film thickness Ts of about 200 nm, and space Ds of about 40 nm is left between neighboring epitaxial silicon layers 12a and 12b as already described. Therefore, an aspect ratio between neighboring epitaxial silicon layers 12a and 12b is about 5, so that a void is very liable to be generated.

As shown in FIG. 32, if a void is formed between neighboring epitaxial silicon layers 12a and 12b, epitaxial silicon layers 12a and 12b, which were electrically insulated from each other, e.g., in the foregoing case B, may be short-circuited due to polycrystalline silicon pieces 21 which are present in the void and are brought into contact with each other due to some reasons after mounted in a product.

If a void is not formed, and particularly in the case B or the like, each polycrystalline silicon piece is buried in the insulating film, so that neighboring epitaxial silicon layers 12a and 12b are electrically insulated from each other. In the case A, however, the neighboring epitaxial silicon layers remain in the short-circuited state even if each polycrystalline silicon piece is buried in the insulating film.

As already described, a plurality of polycrystalline silicon pieces are generated during formation of the epitaxial silicon layers, so that the neighboring epitaxial silicon layers may be short-circuited together through the plurality of polycrystalline silicon pieces. Due to presence of the void, the neighboring epitaxial silicon layers may be further short-circuited through the polycrystalline silicon pieces in the void.

Accordingly, the DRAM suffers from a low reliability.

The invention has been developed for overcoming the above problems, and an object of the invention is to prevent short-circuit between transistors in neighboring memory cells and thereby provide an electrically reliable semiconductor device and another object of the invention is to provide a method of manufacturing the same.

SUMMARY OF THE INVENTION

According to an aspect of the present invention, a semiconductor device includes an element isolating and insulating film, a first doped region and a second doped region, a first epitaxial growth layer and a second epitaxial growth layer, and an insulating layer. The element isolating and insulating film is formed at a main surface of a semiconductor substrate. The first doped region and the second doped region are each formed at a main surface of a region of the semiconductor substrate with the element isolating and insulating film interposed therebetween. The first epitaxial growth layer and the second epitaxial growth layer are formed by selective, epitaxial growth of silicon or silicon-germanium alloy on the first doped region and the second doped region. The insulating layer is formed to cover at least a surface of the first and second epitaxial growth layers.

According to this structure, an insulting layer is formed to cover at least a surface of the first and second epitaxial growth layers. Thus, a short-circuit is not readily caused between the first and second epitaxial growth layers. Consequently, the electrical isolation between the first and second doped regions is improved.

Preferably, the insulating layer is formed by thermally oxidizing the first and second epitaxial growth layers.

In this case, a uniform, isolating layer is formed on a surface of the first and second epitaxial growth layers. Thus, the electrical isolation between the first and second doped regions is further improved.

Still preferably, the semiconductor device has a transistor having a pair of source/drain regions and a gate electrode each formed on a main surface of a region of the semiconductor substrate with the element isolating and insulating film disposed therebetween, and the first doped region includes one source/drain region of one transistor and the second doped region includes one source/drain region of the other transistor.

In this case, the electrical insulating performance of transistors formed at their respective regions of the semiconductor substrate with the element isolating and insulating film interposed therebetween, is improved.

According to another aspect of the invention, a method of manufacturing a semiconductor device includes the following ing steps. A plurality of element formation regions electrically isolated from each other by an element isolating and insulating film is formed at a main surface of a semiconductor substrate. A pair of source/drain regions spaced by a predetermined distance is formed at the element formation regions opposed to each other with the element isolating and insulating film therebetween, respectively. A gate electrode is formed on a region located between the paired source and drain regions at the main surface with a gate insulating film therebetween. An epitaxial growth step is performed to form epitaxial layers by selective epitaxial growth of silicon or silicon-germanium alloy on the surfaces of the source/drain regions. Inter-element insulating processing is effected on the main surface of the semiconductor substrate to oxidize or remove polycrystalline silicon generated in the epitaxial growth step for electrically insulating the epitaxial layers opposed to each other with the element isolating and insulating film therebetween. After the inter-element insulating step, an interlayer insulating film is formed at the main surface of the semiconductor substrate.

According to this method, an MOS transistor including a pair of source/drain regions and a gate electrode is formed at each of the regions at the main surface of the semiconductor substrate opposed to each other with the element isolating and insulating film therebetween. In the epitaxial growth step, silicon pieces adhere onto the element isolating and insulating film between the epitaxial silicon layers which are formed at the source/drain regions of the neighboring MOS transistors, respectively. However, the silicon pieces are oxidized or removed in the inter-element insulating step, so that short-circuit between the source/drain regions of the neighboring MOS transistors is prevented. As a result, the semiconductor device can have a good electrical reliability.

Preferably, the method further includes the following steps between the inter-element insulating step and the step of forming the interlayer insulating film. Processing is performed to form a bit line electrically connected to one of the paired source and drain regions. Also, processing is performed to form a capacitor electrically connected to the other of the paired source and drain regions.

The memory cell thus formed has a structure of one-transistor and one-capacitor.

More preferably, the inter-element insulating step includes a first oxidizing step of exposing the surface of the semiconductor substrate including a surface of the selectively grown silicon to an atmosphere containing oxygen.

In this case, the semiconductor substrate is exposed to the atmosphere including oxygen, so that surfaces of silicon pieces react with oxygen to form silicon oxide films. Thereby, each of polycrystalline silicon pieces is electrically insulated. Simultaneously, a silicon oxide film is formed at the surface of the epitaxially grown silicon. This improves an electrical insulating performance between the source/drain regions of the neighboring MOS transistors. Consequently, it is possible to provide a semiconductor device having a further improved electrical reliability.

More preferably, the inter-element insulating step further includes, after the first oxidizing step, a hydrofluoric acid treatment step of immersing the semiconductor substrate in a solution containing hydrofluoric acid or exposing the semiconductor substrate to a gas containing hydrofluoric acid.

In this case, the treatment with the hydrofluoric acid removes a silicon oxide film formed at the surface of the epitaxial layer and silicon oxide films formed around silicon pieces. In some cases, the silicon oxide film may not be sufficiently formed at the surface of the epitaxial layer, and the polycrystalline silicon pieces poor in an electrical insulating performance may be present at the surface. Even in these cases, all polycrystalline silicon pieces including the above polycrystalline silicon pieces are removed, so that the electrical insulating performance between the source/drain regions of the neighboring MOS transistors is further improved. As a result, the semiconductor device can have a further improved electrical reliability.

More preferably, the inter-element insulating step further includes, after the hydrofluoric acid treatment step, a second oxidizing step of exposing the surface of the semiconductor substrate to an atmosphere containing oxygen.

In this case, a silicon oxide film is formed at the surface of the epitaxial layer. This securely provides an electrical insulation between the source/drain regions of the neighboring MOS transistors. As a result, the semiconductor device can have an improved electrical reliability.

More preferably, the inter-element insulating step includes the following steps. A metal film is formed at the surface of the semiconductor substrate including a surface of the selectively grown silicon. A heat treatment is effected on the semiconductor substrate including the metal film. The metal film is removed after the heat treatment.

In this case, the metal film is formed on the semiconductor substrate including the neighboring MOS transistors. Owing to the heat treatment at a predetermined temperature, silicon in the epitaxial layer and the metal layer react with each other to form a metal silicide film. Since silicon pieces are extremely small in quantity, they diffuse into the metal film. Thereafter, the metal film is removed. Thereby, the source/drain regions of the neighboring MOS transistors are electrically insulated from each other. As a result, the semiconductor device can have an improved electrical reliability.

The metal film may be made of titanium, cobalt, zirconium or hafnium. The step of removing the metal film includes a step of immersing the semiconductor substrate in a mixture solution of sulfuric acid and hydrogen peroxide.

More preferably, the inter-element insulating step further includes a third oxidizing step of exposing the semiconductor substrate to an atmosphere containing oxygen after removing the metal film.

In this case, a silicon oxide film is formed at the surface of the epitaxial layer. This surely provides an electrical insulation between the source/drain regions of the neighboring MOS transistors. As a result, the semiconductor device can have an improved electrical reliability.

More preferably, the inter-element insulating step includes the following steps. An insulating film is formed at a predetermined region of the element isolating and insulating film. The insulating film is removed after the epitaxial growth step.

In this case, the insulating film is formed at the surface of the predetermined region of the element isolating and insulating film. In the process of epitaxial growth, epitaxial layers are formed at surfaces of the source/drain regions of the neighboring MOS transistors, respectively. Silicon pieces adhere onto the insulating film between these epitaxial layers. When removing the insulating film, the silicon pieces are simultaneously removed. This further improves the insulating performance between the source/drain regions of the neighboring MOS transistors. As a result, the semiconductor device can have an improved electrical reliability.

The above insulating film may be a silicon nitride film. The step of removing the insulating film includes a step of removing the silicon nitride film with a solution containing phosphoric acid.

More preferably, the inter-element insulating step further includes a fourth oxidizing step of exposing the semiconductor substrate to an atmosphere containing oxygen after removing the insulating film.

In this case, a silicon oxide film is formed at the surface of the epitaxial layer. This surely provides an electrical insulation between the source/drain regions of the neighboring MOS transistors. As a result, the semiconductor device can have an improved electrical reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
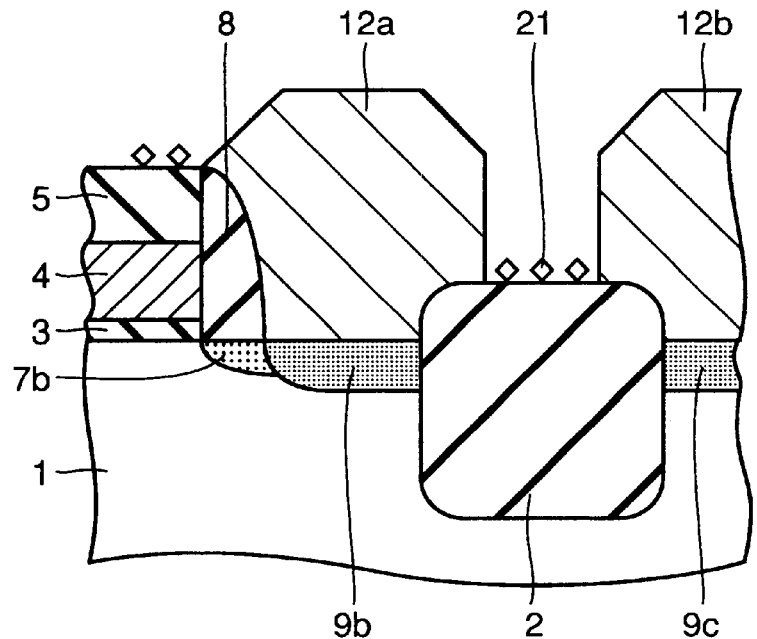
FIG. 1 shows a step in a method of manufacturing a semiconductor device according to an embodiment 1 of the invention.

A method of manufacturing a semiconductor device according to an embodiment 1 of the invention will now be described below with reference to the drawings. Steps preceding or including the step shown in FIG. 1 are the same as those in the method of manufacturing the semiconductor device already described as a prior art, and more specifically are the same as the steps preceding or including the step in FIG. 30. Through these steps, a film thickness of an epitaxial silicon layer exceeds a threshold value, and silicon pieces are generated on an element isolating and insulating film 2, as already described in connection with the prior art.

Figure 2:
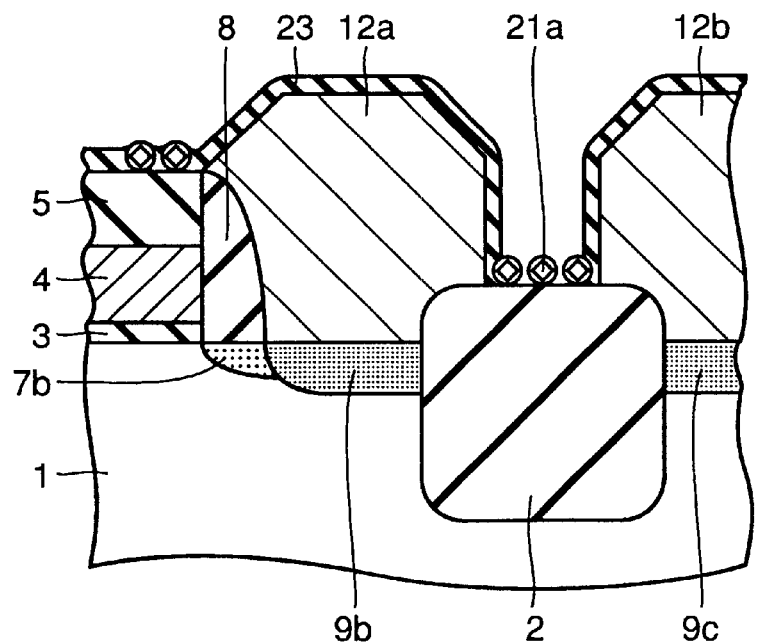
FIG. 2 is a cross section showing a step in the same embodiment following the step shown in FIG. 1.

Referring to FIG. 2, a silicon oxide film 23 is formed by exposing a semiconductor substrate to an oxygen atmosphere. In this processing, an appropriate temperature is in a range from 600 to 850° C., and an appropriate pressure is in a range from about 10 to about 760 Torr. Hydrogen or moisture may be mixed therewith, whereby silicon oxide film 23 thus formed can have a high insulating performance.

By the above processing, surfaces of polycrystalline silicon pieces 21a and epitaxial silicon layers 12a and 12b are coated with silicon oxide films having a sufficient insulating performance as a result of reaction with oxygen.

Figure 3:
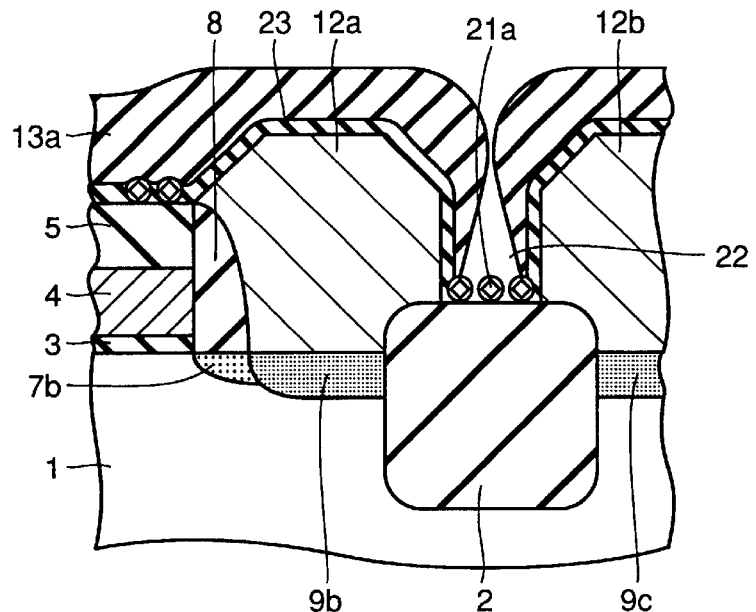
FIG. 3 is a cross section showing a step in the same embodiment following the step shown in FIG. 2.
Figure 4:
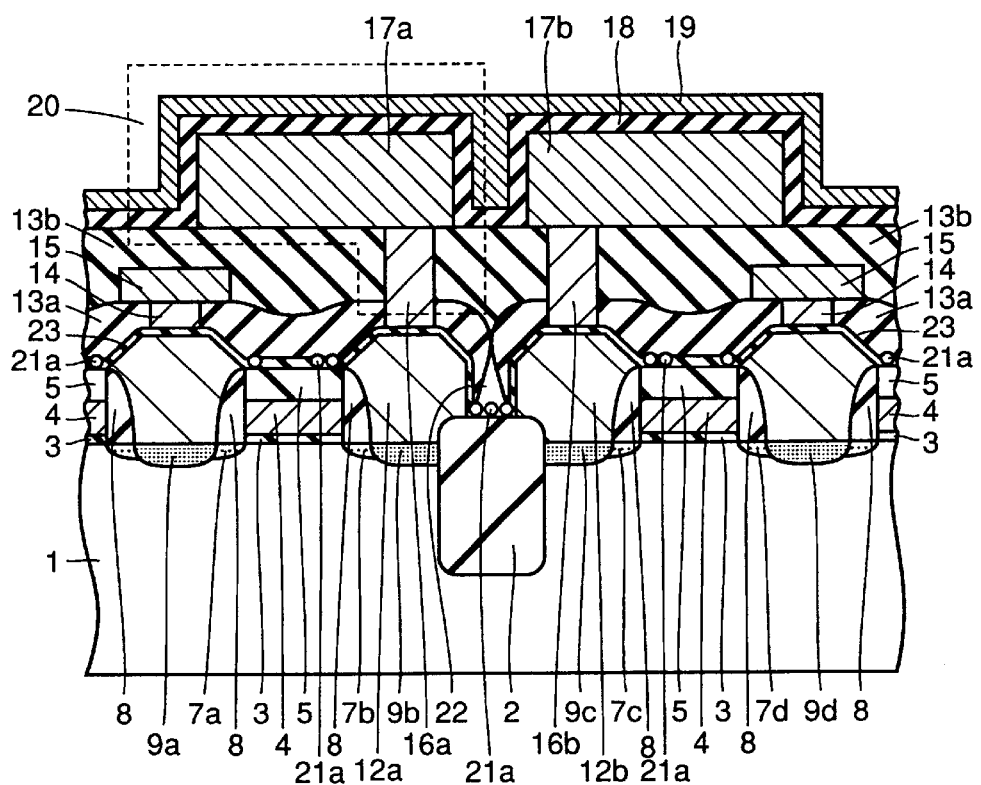
FIG. 4 is a cross section showing a step in the same embodiment following the step shown in FIG. 3.
Figure 30:
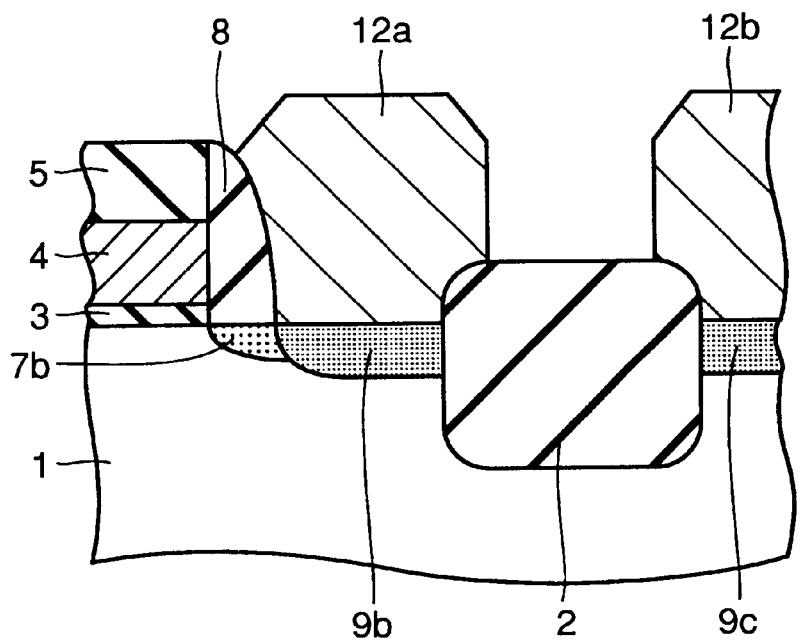
FIG. 30 is a cross section showing a step following the step shown in FIG. 29.
Figure 31:
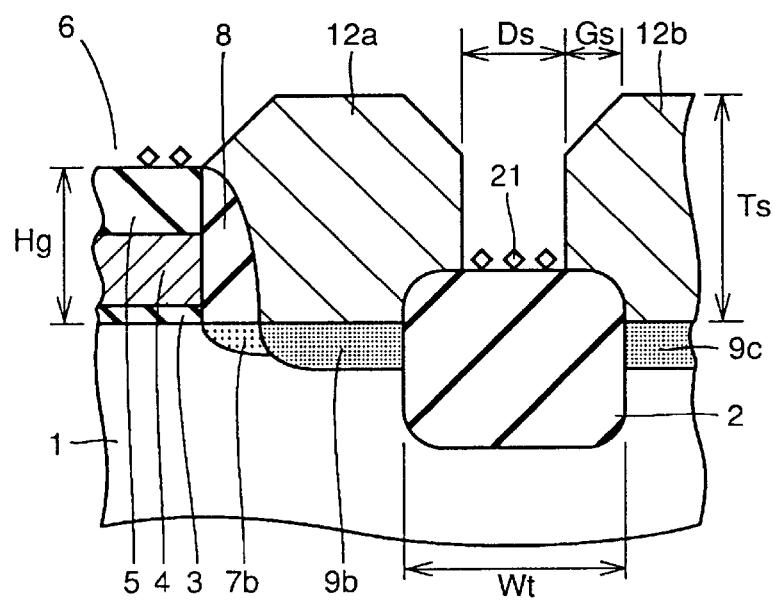
FIG. 31 is a cross section showing a step following the step shown in FIG. 30.
Figure 32:
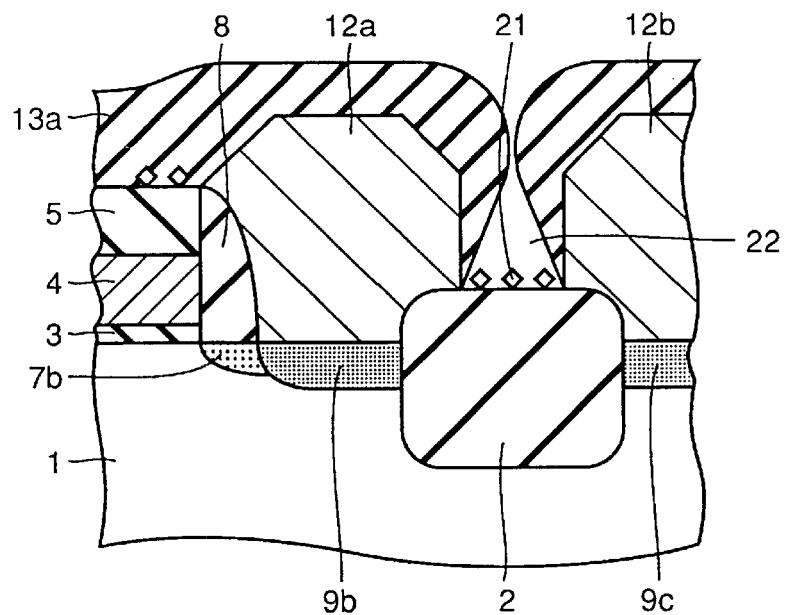
FIG. 32 is a cross section showing a step following the step shown in FIG. 31.

Referring to FIG. 3, an insulating film 13a is then formed on silicon oxide film 23. Then, a capacitor 20 is formed as shown in FIG. 4 through the same steps as those which are shown in FIGS. 30 and 31 and are already described as a prior art. Thereafter, metal interconnections and others are formed on capacitor 20 with an interlayer insulating film therebetween, so that a DRAM is completed.

According to the method of manufacturing the DRAM described above, the semiconductor substrate is exposed to an atmosphere containing oxygen, so that silicon at the surfaces of polycrystalline silicon pieces 21 react with oxygen to form silicon oxide films. Simultaneously, silicon oxide films 23 are formed at the surfaces of epitaxial silicon layers 12a and 12b. Thereby, an insulating performance between neighboring epitaxial silicon layers 12a and 12b is improved, and short-circuit between the source/drain regions of the neighboring MOS transistors is prevented. As a result, an electrical reliability of the DRAM is improved.

As shown in FIG. 3, a void 22 may be generated at insulating film 13a. Even in this case, short-circuit between neighboring epitaxial layers 12a and 12b is prevented because the silicon oxide films coat the surfaces of polycrystalline silicon pieces 21a. Thereby, the source/drain regions of the neighboring MOS transistors are electrically insulated from each other.

Embodiment 2

Figure 5:
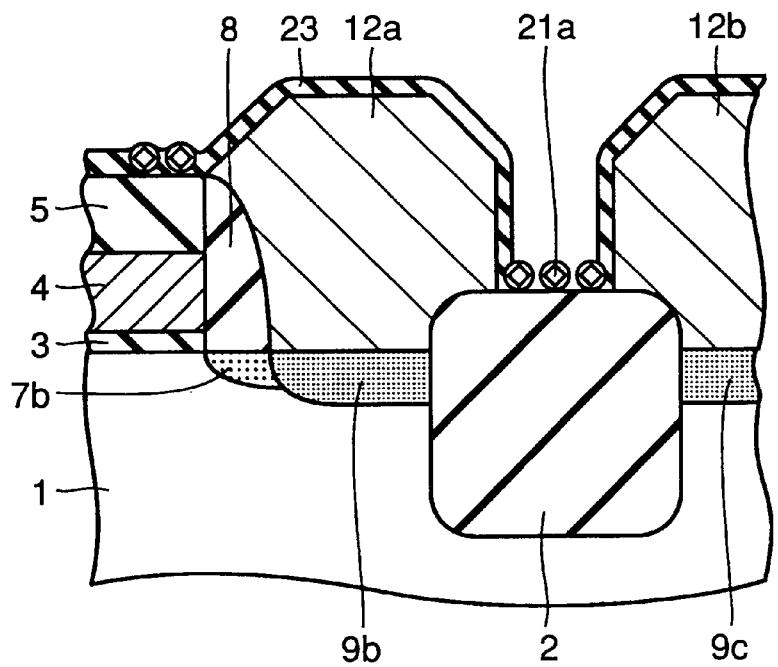
FIG. 5 shows a step in a method of manufacturing a semiconductor device according to an embodiment 2 of the invention.

A method of manufacturing a semiconductor device according to an embodiment 2 will be described below with reference to the drawings. Steps preceding or including a step shown in FIG. 5 are the same as those preceding or including the foregoing step of the embodiment 1 shown in FIG. 2, and therefore will not be described below in detail. Thereafter, the semiconductor substrate is immersed in a hydrofluoric acid solution. A concentration of the hydrofluoric acid solution is preferably in a range from 0.5 to 1.0%, and an immersion time is preferably in a range from about 10 to about 30 seconds.

Figure 6:
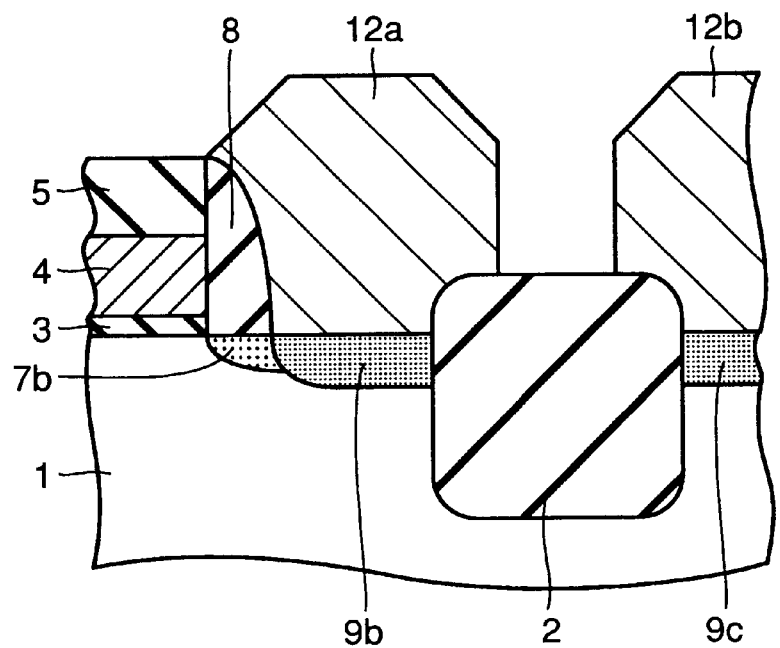
FIG. 6 is a cross section showing a step in the same embodiment following the step shown in FIG. 5.
Figure 7:
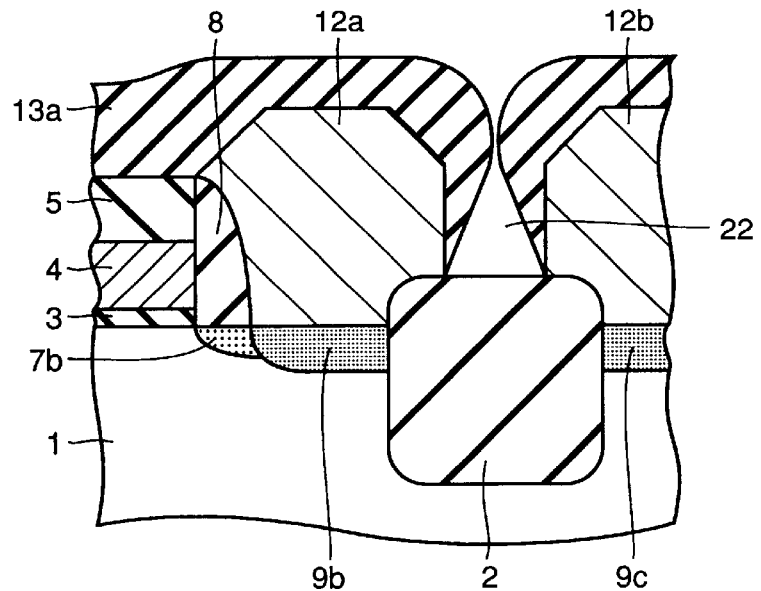
FIG. 7 is a cross section showing a step in the same embodiment following the step shown in FIG. 6.
Figure 8:
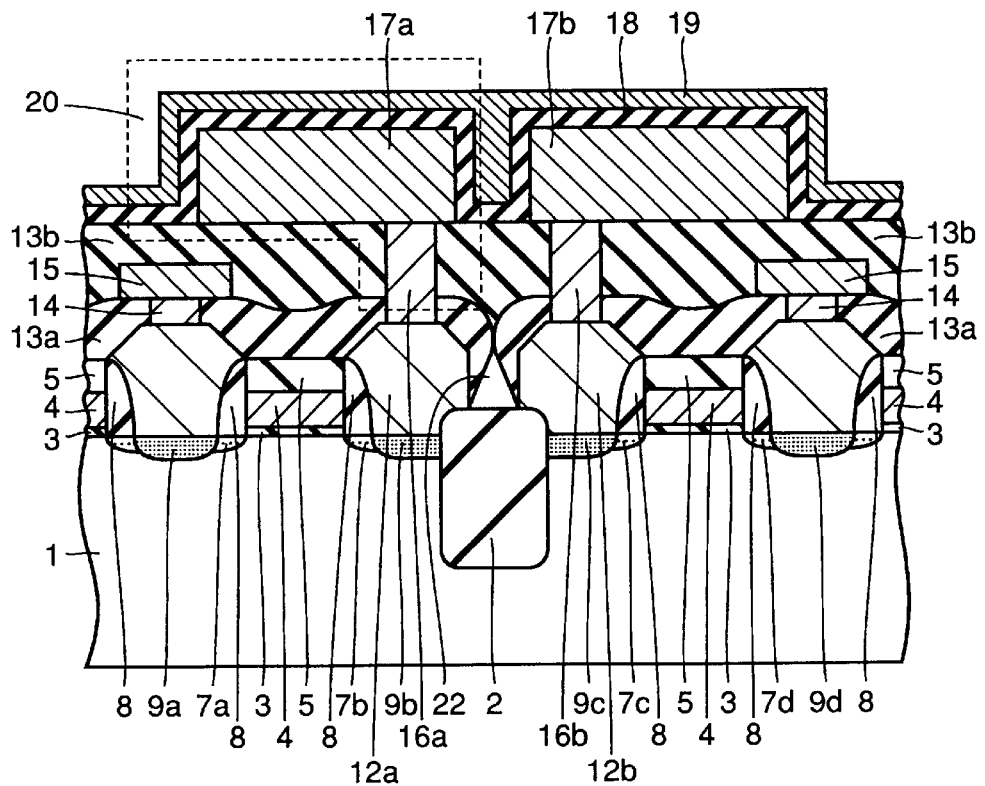
FIG. 8 is a cross section showing a step in the same embodiment following the step shown in FIG. 7.

Thereby, silicon oxide film 23 is dissolved in the hydrofluoric acid solution as shown in FIG. 6. In this processing, polycrystalline silicon pieces 21a coated with silicon oxide films 23 shown in FIG. 5 sink in the hydrofluoric acid solution. Then, insulating film 13a is formed as shown in FIG. 7. Thereafter, capacitor 20 and others are formed so that the DRAM is completed as shown in FIG. 8.

According to this manufacturing method, silicon oxide film 23 shown in FIG. 5 is dissolved in the hydrofluoric acid solution in the step shown in FIG. 6, and polycrystalline silicon pieces 21a sink in the hydrofluoric acid solution. In this processing, all polycrystalline silicon pieces including those poor in an insulating performance are removed from element isolating and insulating film 2 even if the silicon oxide film was not sufficiently form at the surface in the step shown in FIG. 2 and already described in connection with the embodiment 1, and therefore the polycrystalline silicon pieces poor in an insulating performance were present at the surface. Moreover, an electrical insulating performance between neighboring epitaxial silicon layers 12a and 12b is further improved regardless of whether a void is present between them or not, because all the polycrystalline silicon pieces are removed. As a result, the electrical insulating performance between the source/drain regions of the neighboring MOS transistors is further improved, and the electrical reliability is further improved.

In the above processing, the semiconductor device is immersed in the hydrofluoric acid solution. Alternatively, the semiconductor substrate may be exposed to a gas containing hydrofluoric acid for achieving the same effect.

Embodiment 3

Figure 9:
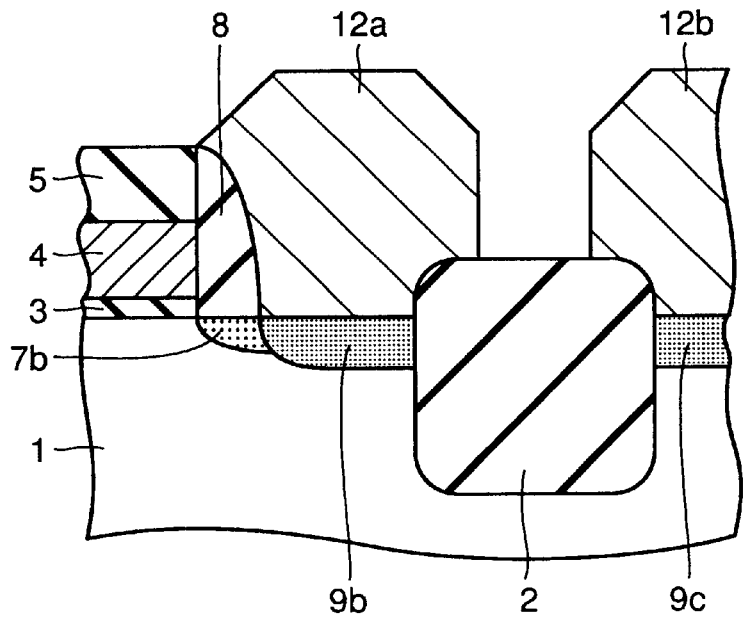
FIG. 9 shows a step in a method of manufacturing a semiconductor device according to an embodiment 3 of the invention.

A method of manufacturing a semiconductor device according to an embodiment 3 will be described below with reference to the drawings. Steps preceding or including a step shown in FIG. 9 are the same as those preceding or including the foregoing step of the embodiment 2 shown in FIG. 6, and therefore will not be described below in detail.

Then, the semiconductor substrate is immersed in a hydrofluoric acid solution and is exposed to an oxygen atmosphere. In this processing, an appropriate temperature is in a range from 600 to 850° C., and an appropriate pressure is in a range from about 10 to about 760 Torr. Hydrogen or moisture may be mixed in the oxygen atmosphere. Thereby, silicon at the surfaces of epitaxial silicon layers 12a and 12b react with oxygen to form silicon oxide films 29 as shown in FIG. 10.

Figure 11:
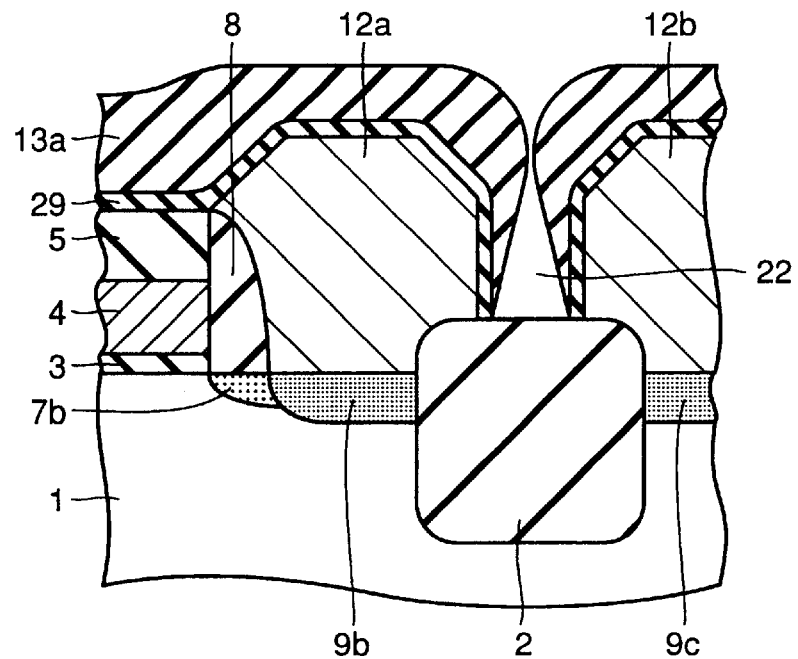
FIG. 11 is a cross section showing a step in the same embodiment following the step shown in FIG. 10.

Referring to FIG. 11, insulating film 13a is formed on silicon oxide film 29. Then, capacitors and others are formed similarly to the embodiments 1 and 2, so that the DRAM is completed.

Particularly in this structure, source/drain region 9b as a first doped region, and source/drain region 9c as a second doped region are formed. Epitaxial silicon layer 12a as a first epitaxial growth layer, and epitaxial silicon layer 12b as a second epitaxial growth layer are formed. Silicon oxide film 23 as an insulating layer is formed to cover a surface of epitaxial silicon layers 12a and 12b.

Figure 10:
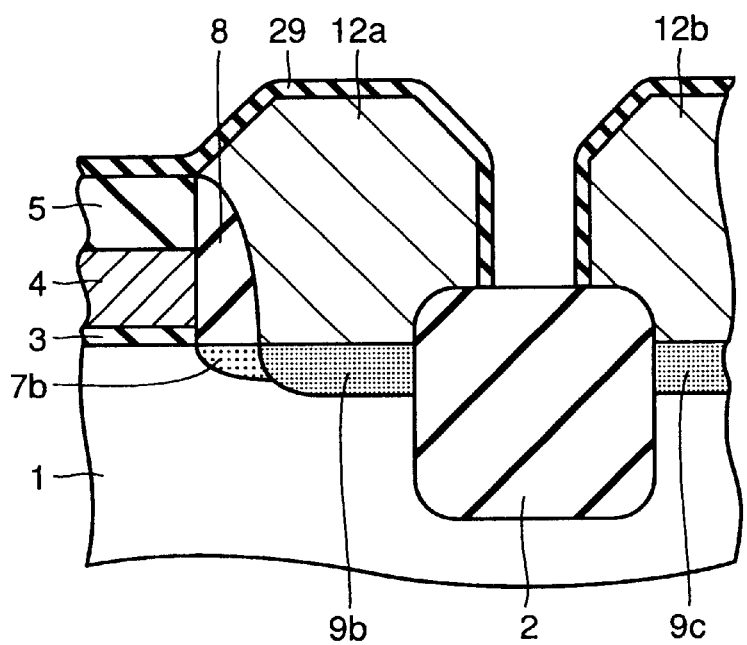
FIG. 10 is a cross section showing a step in the same embodiment following the step shown in FIG. 9.

Furthermore, according to this manufacturing method, and particularly in the step shown in FIG. 10, silicon oxide films 29 are formed at the surfaces of epitaxial silicon layers 12a and 12b. This further improves the insulating performance between the neighboring epitaxial silicon layers 12a and 12b, and short-circuit between the source/drain regions of the neighboring MOS transistors can be prevented. As a result, the electrical reliability of the DRAM can be further improved.

Embodiment 4

Figure 12:
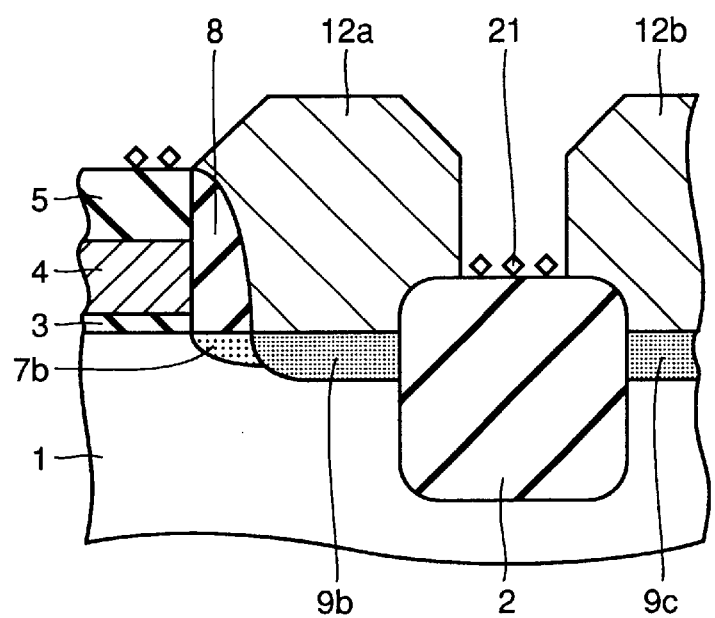
FIG. 12 shows a step in a method of manufacturing a semiconductor device according to an embodiment 4 of the invention.

A method of manufacturing a semiconductor device according to an embodiment 4 will be described below with reference to the drawings. Steps preceding or including a step shown in FIG. 12 are the same as those preceding or including the foregoing step of the embodiment 1 shown in FIG. 1, and therefore will not be described below in detail.

Figure 13:
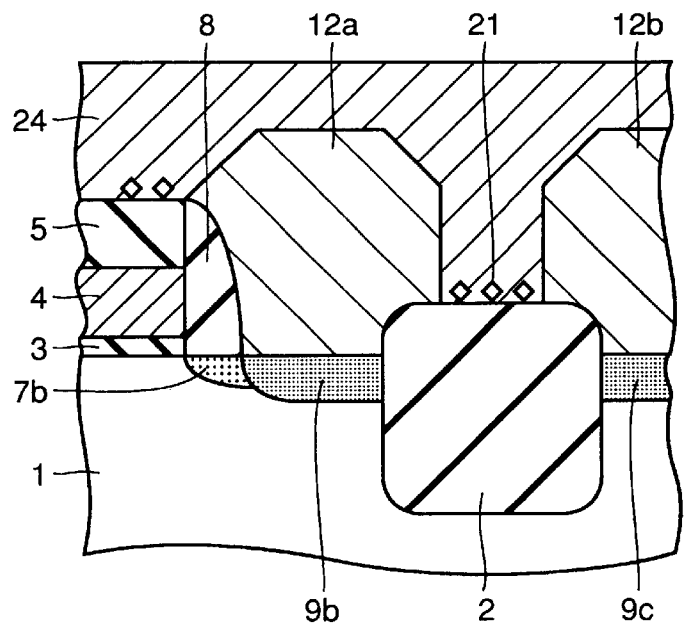
FIG. 13 is a cross section showing a step in the same embodiment following the step shown in FIG. 12.

As shown in FIG. 13, a sputtering method or the like is performed to form a titanium film 24 on the silicon substrate including epitaxial silicon layers 12a and 12b. Then, the silicon substrate including titanium film 24 is heated in a nitrogen atmosphere. In this processing, the temperature is preferably in a range from 600 to 750° C., and the heating time is preferably in a range from 30 to 90 seconds. Thereby, silicon and titanium at the vicinity of the interface between epitaxial silicon layers 12a and 12 and titanium film 24 react with each other to form titanium silicide films 25.

Then, the silicon substrate including titanium films 24 is immersed in a mixture solution of sulfuric acid and hydrogen peroxide. A mixing rate between the sulfuric acid and the hydrogen peroxide is in a range from 3:1 to 5:1. An appropriate temperature of the solution is in a range from 80 to 130° C., and an appropriate immersion time is in a range from 10 to 20 minutes. Thereby, unreacted titanium films 24 shown in FIG. 14 are removed as shown in FIG. 15.

Figure 16:
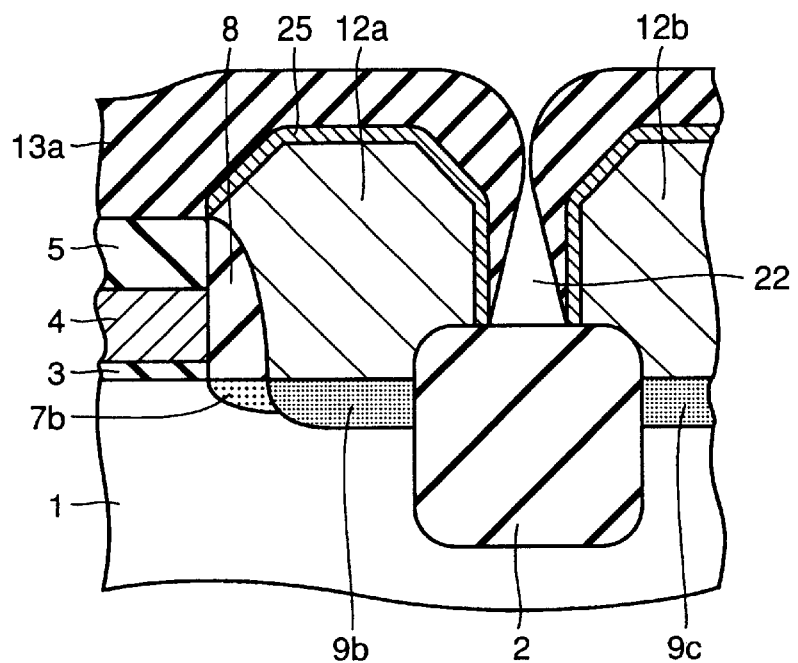
FIG. 16 is a cross section showing a step in the same embodiment following the step shown in FIG. 15.
Figure 17:
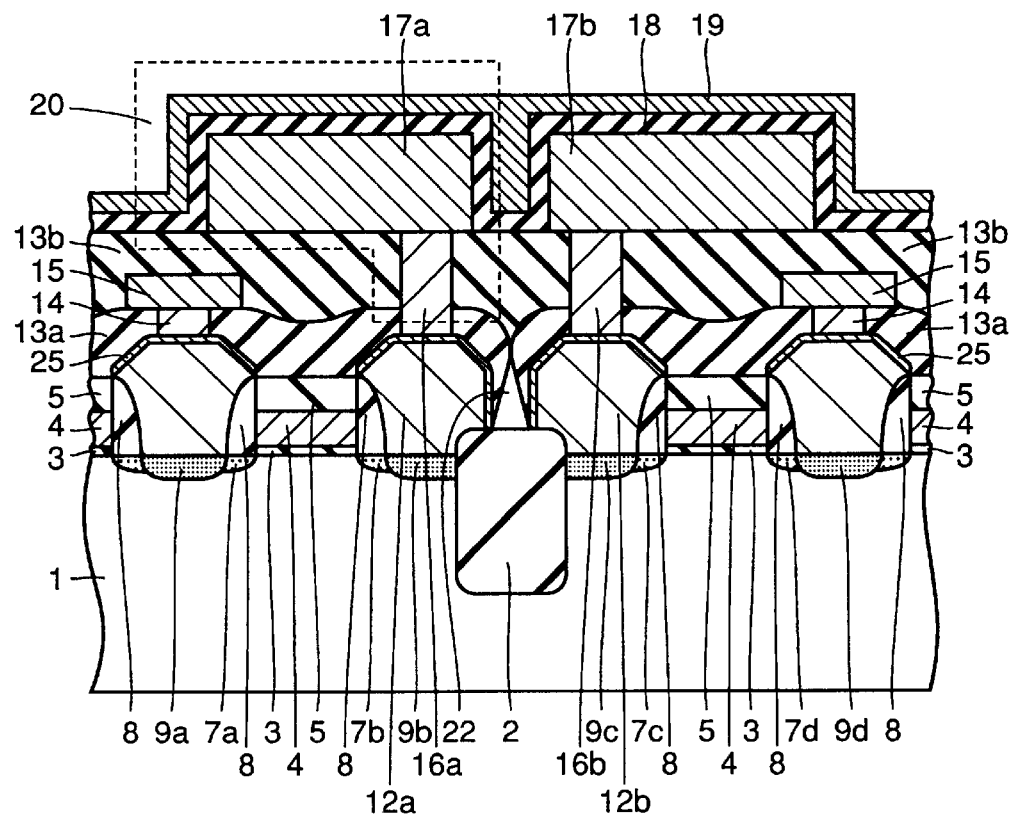
FIG. 17 is a cross section showing a step in the same embodiment following the step shown in FIG. 16.

Referring to FIG. 16, insulating film 13a is formed on the silicon substrate including titanium silicide films 25. Then, steps similar to those in the embodiment 1 already described are performed, so that the DRAM is completed as shown in FIG. 17.

Figure 14:
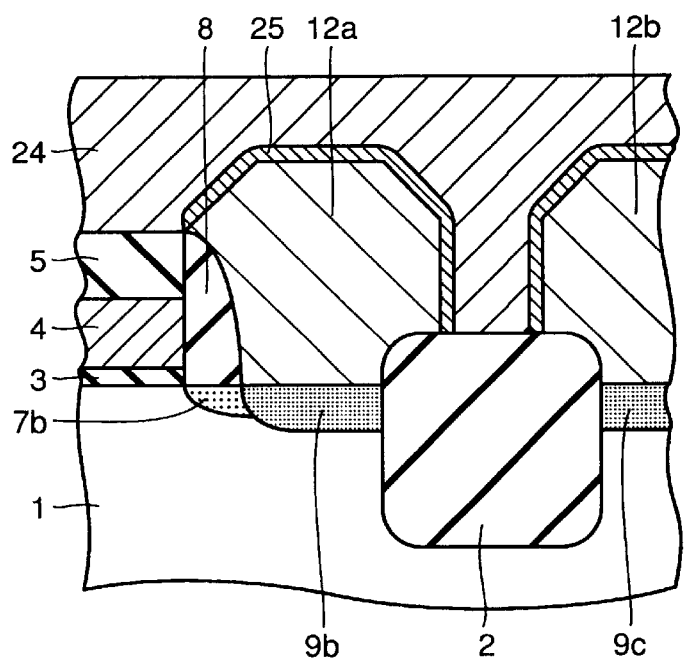
FIG. 14 is a cross section showing a step in the same embodiment following the step shown in FIG. 13.
Figure 15:
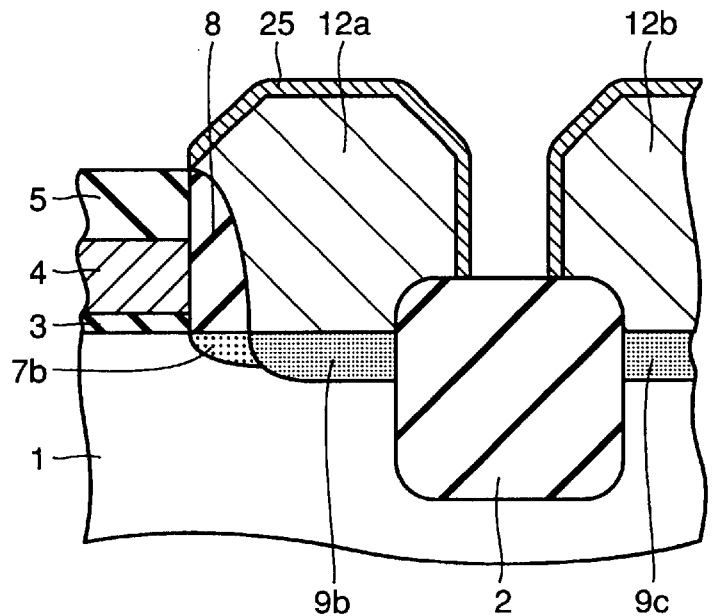
FIG. 15 is a cross section showing a step in the same embodiment following the step shown in FIG. 14.

According to this manufacturing method, silicide reaction occurs between the titanium films 24 and the epitaxial silicon layers 12a and 12b in the step shown in FIG. 14, so that titanium silicide films 25 are formed. In this processing, since polycrystalline silicon pieces 21 are relatively small in quantity, they diffuse into titanium films 24 to disappear.

In this step, an upper limit of the temperature of heat treatment is particularly important, and must be 750° C. or lower by the following reason. In the temperature range from 600 to 750° C., titanium does not react with silicon at the interface between the titanium film and the silicon oxide film, but reacts with nitrogen to form the titanium nitride film. If the heat temperature higher than 750° C. were performed, titanium would react with the silicon oxide film to from a titanium silicide film, resulting in short-circuit between the neighboring MOS transistors in some cases.

Then, an immersing step is performed, and more specifically the silicon substrate is immersed in a mixture solution of sulfuric acid and hydrogen peroxide, so that titanium films 24 are selectively dissolved. Thereby, the polycrystalline silicon pieces are completely removed from the silicon substrate. As a result, an insulating performance between the source/drain regions of the neighboring MOS transistors is further improved, and the DRAM can have an improved electrical reliability.

Although the metal film made of titanium has been described, the metal film made of another material such as cobalt, zirconium or hafnium may be employed for achieving a similar effect provided that the metal can react with silicon to form metal silicide. In the step shown in FIG. 16, the silicon substrate may be exposed to an oxygen atmosphere to form a silicon oxide film at the surface of titanium silicide film 25 before forming insulating film 13a. This further improves the electrical insulating performance between the source/drain regions of the neighboring MOS transistors.

Embodiment 5

Figure 18:
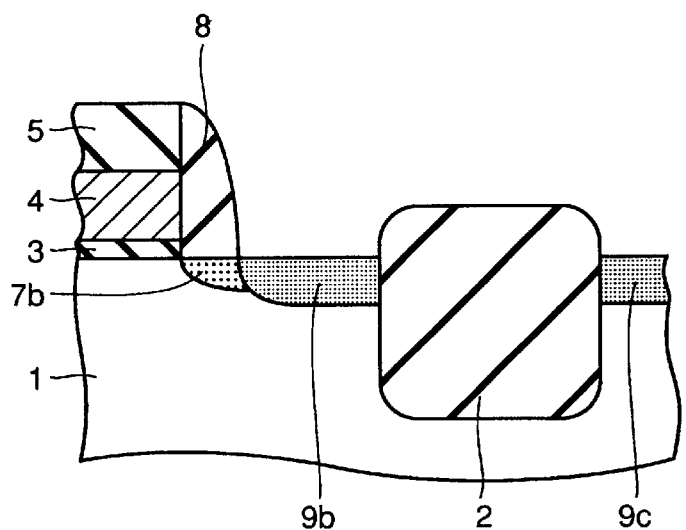
FIG. 18 shows a step in a method of manufacturing a semiconductor device according to an embodiment 5 of the invention.
Figure 25:
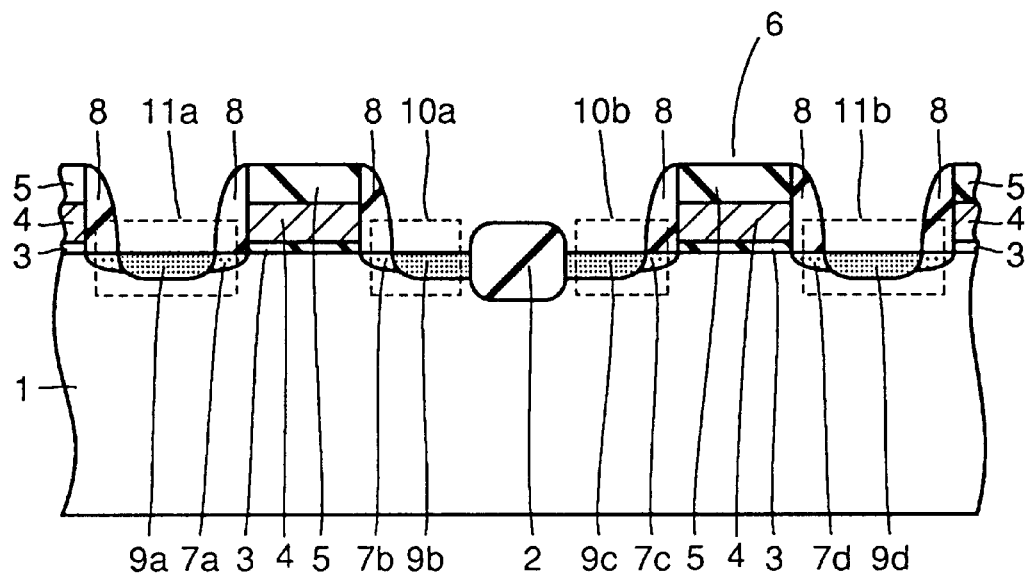
FIG. 25 is a cross section showing a step following the step shown in FIG. 24.
Figure 26:
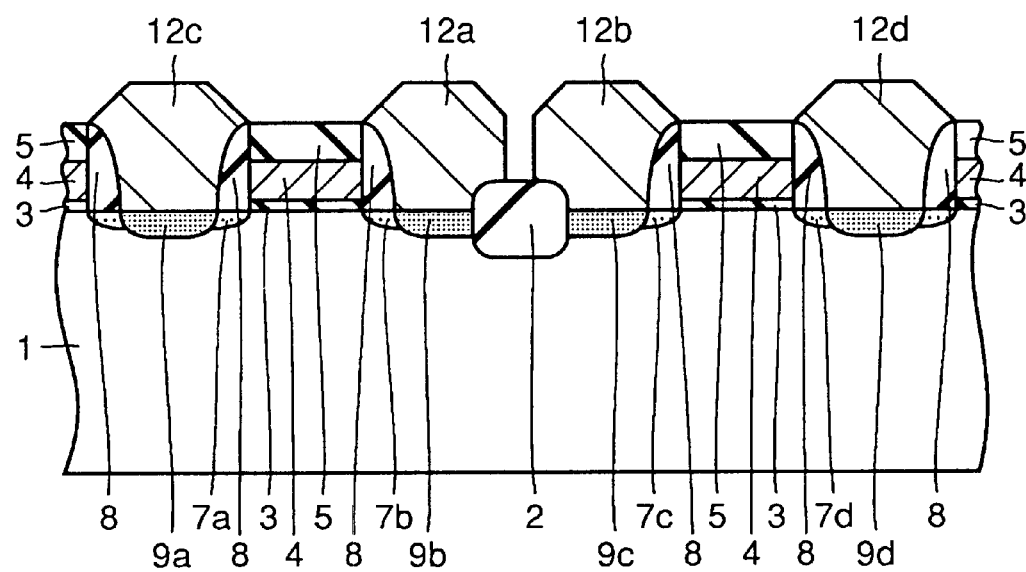
FIG. 26 is a cross section showing a step following the step shown in FIG. 25.
Figure 27:
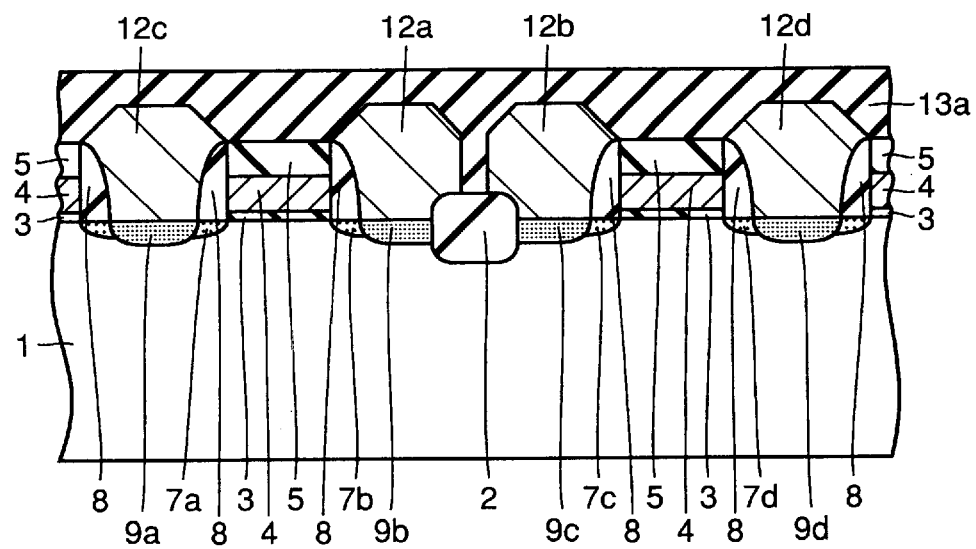
FIG. 27 is a cross section showing a step following the step shown in FIG. 26.
Figure 28:
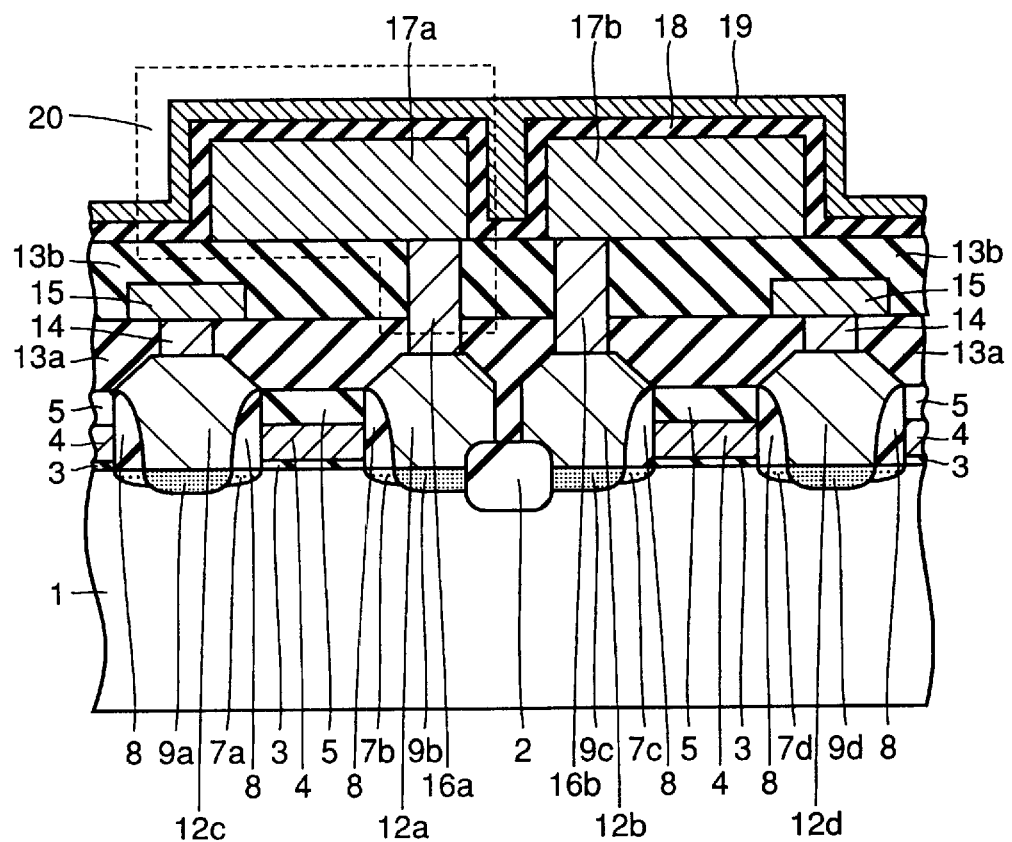
FIG. 28 is a cross section showing a step following the step shown in FIG. 27.
Figure 29:
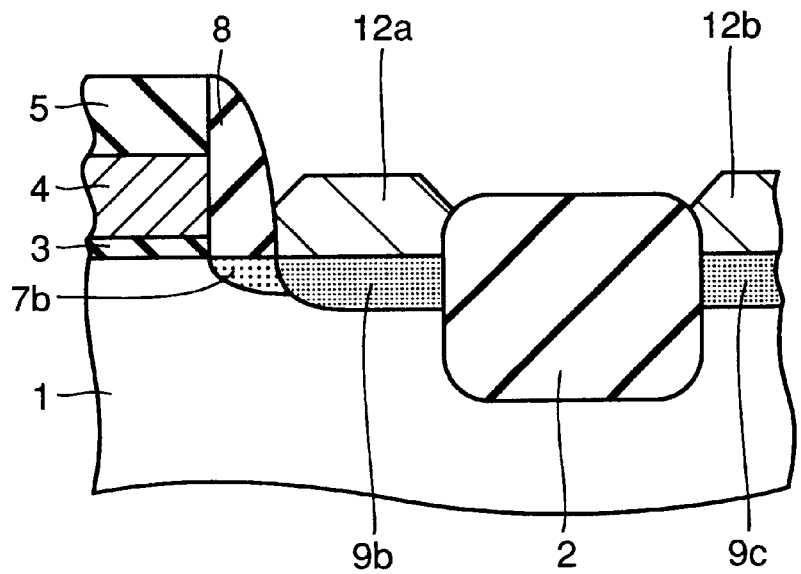
FIG. 29 is a cross section showing a problem in a conventional method of manufacturing a semiconductor device, and particularly showing a step in the method.

A method of manufacturing a semiconductor device according to an embodiment 5 will be described below with reference to the drawings. Steps preceding or including a step shown in FIG. 18 are the same as those preceding or including the step in the prior art shown in FIG. 25, and therefore will not be described below in detail.

Figure 19:
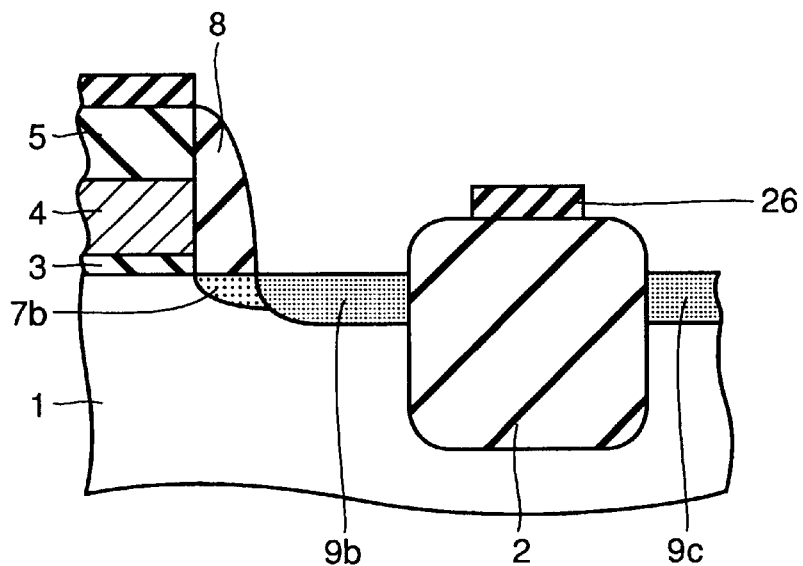
FIG. 19 is a cross section showing a step in the same embodiment following the step shown in FIG. 18.
Figure 20:
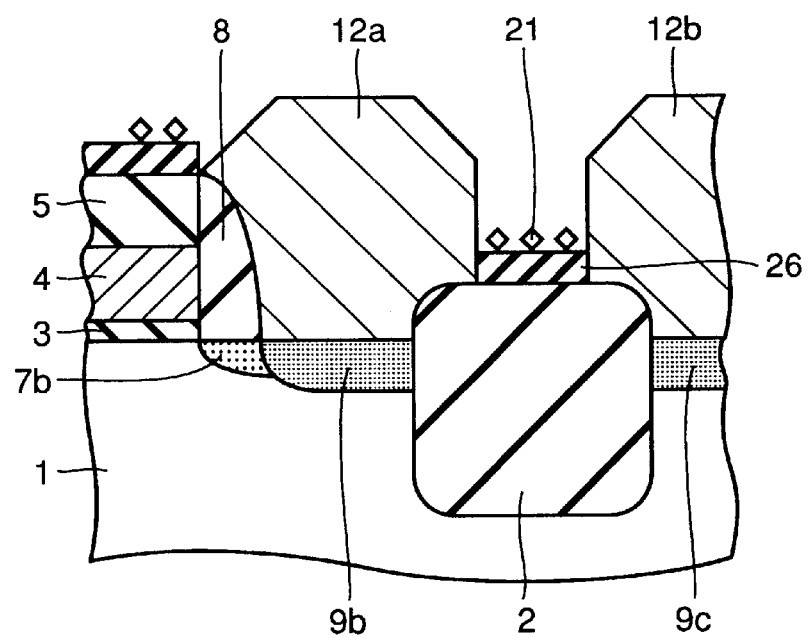
FIG. 20 is a cross section showing a step in the same embodiment following the step shown in FIG. 19.

Referring to FIG. 19, a silicon nitride film 26 is formed at a predetermined region including element isolating and insulating film 2. Referring to FIG. 20, epitaxial silicon layers 12a and 12b are then formed on $n^+$-source/drain regions 9b and 9c, respectively. In this processing, polycrystalline silicon pieces 21 are generated on silicon nitride film 26.

Figure 21:
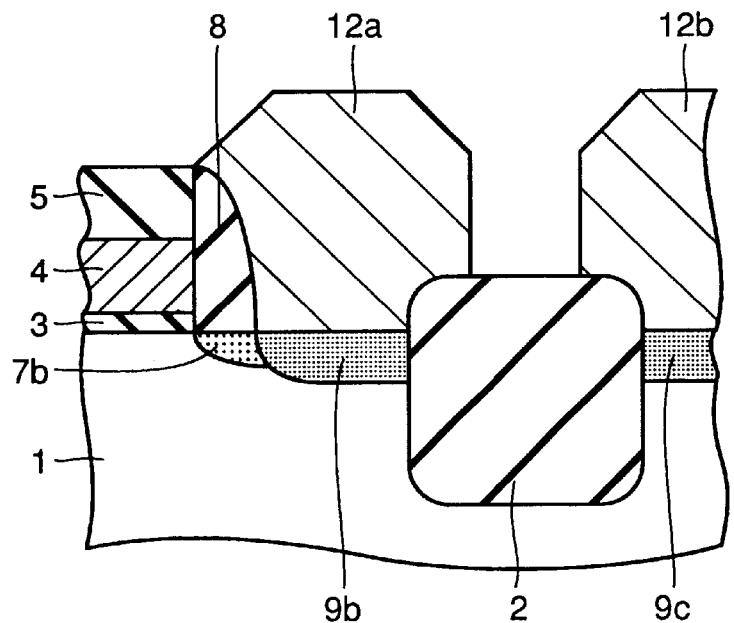
FIG. 21 is a cross section showing a step in the same embodiment following the step shown in FIG. 20.
Figure 22:
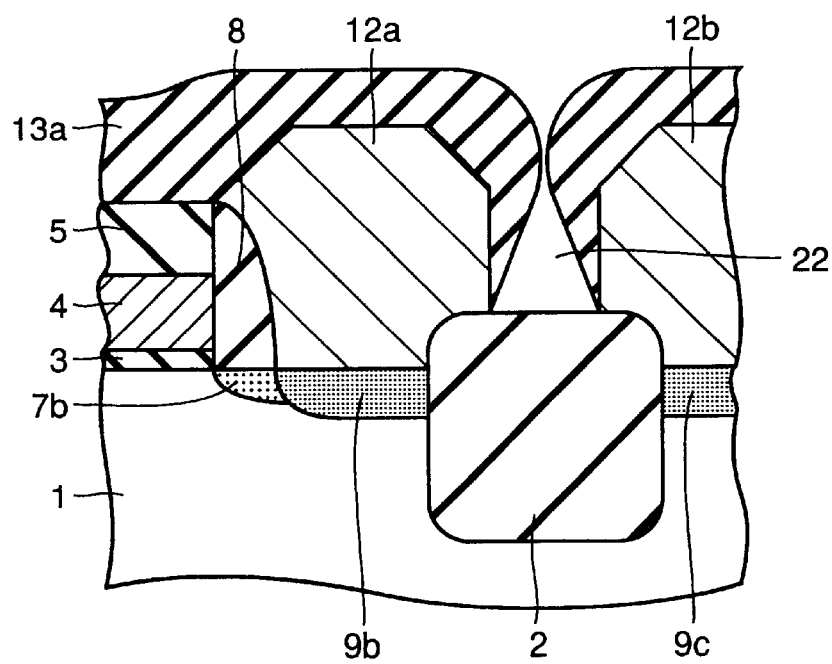
FIG. 22 is a cross section showing a step in the same embodiment following the step shown in FIG. 21.
Figure 23:
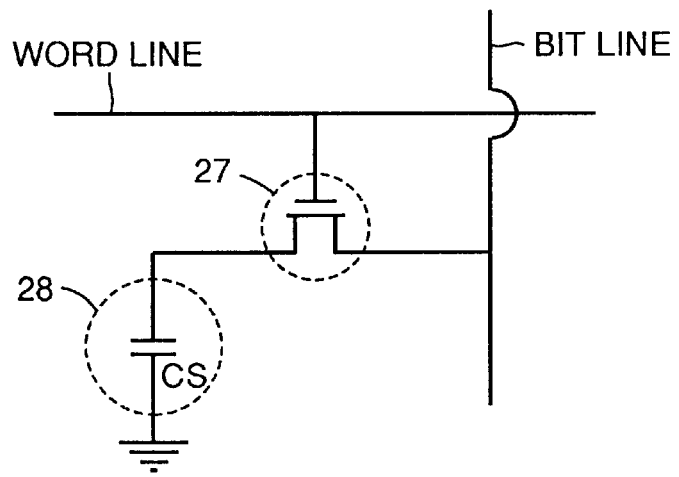
FIG. 23 is a circuit diagram of a memory cell for one bit in a DRAM.
Figure 24:
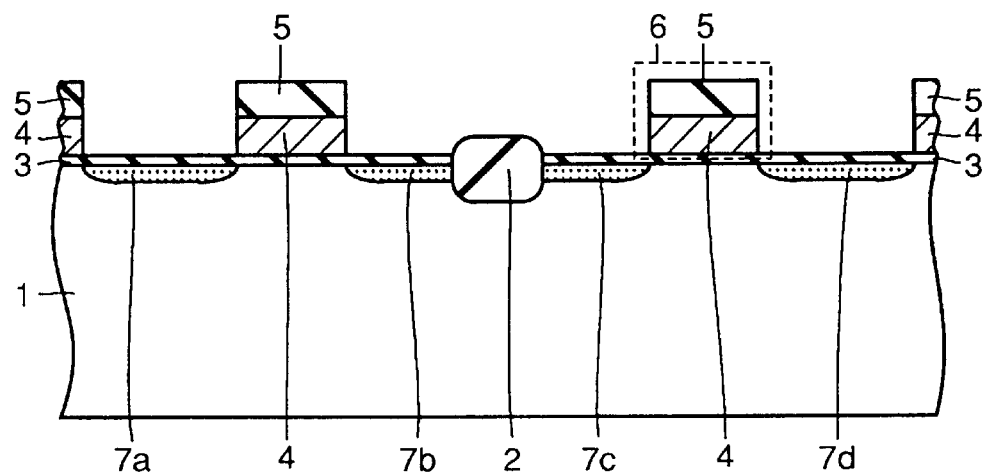
FIG. 24 is a cross section showing a step in a conventional method of manufacturing a semiconductor device.

Then, the silicon substrate is immersed in a solution containing phosphoric acid. The concentration of phosphoric acid in the solution is preferably in a range from 10 to 60%. The immersion time is preferably in a range from 30 to 60 minutes, and the temperature is preferably in a range from 120 to 180° C. Thereby, silicon nitride film 26 shown in FIG. 20 is dissolved as shown in FIG. 21. Then, as shown in FIG. 22, insulating film 13a is formed at the surface of the silicon substrate including the surfaces of epitaxial silicon layers 12a and 12b. Thereafter, the DRAM is completed through steps similar to those of the embodiment 1 already described.

According to this manufacturing method, silicon nitride film 26 shown in FIG. 20 is selectively dissolved in the phosphoric acid solution at the step shown in FIG. 21. In this processing, polycrystalline silicon pieces 21 existing on silicon nitride film 26 sink in the phosphoric acid solution. Thereby, the polycrystalline silicon pieces are removed from element isolating and insulating film 2, and the insulating performance between neighboring epitaxial silicon layers 12a and 12b is further improved. As a result, the electrical insulating performance between the source/drain regions of the neighboring MOS transistors is further improved, and the semiconductor device can have an improved electrical reliability.

In the step shown in FIG. 22, the silicon substrate may be exposed to an atmosphere containing oxygen before formation of insulating film 13a for forming silicon oxide films at the surface of epitaxial silicon layers 12a and 12b, respectively. In this case, the insulating performance between the adjacent epitaxial silicon layers 12a and 12b is further improved.

The embodiments 1 to 5 described above employ the epitaxial silicon layer. Alternatively, selective epitaxial growth of silicon-germanium alloy may be employed, in which case a similar effect can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

an element isolating and insulating film formed at a main surface of a semiconductor substrate;

first and second doped regions each formed at a main surface of a region of said semiconductor substrate with said element isolating and insulating film interposed therebetween;

the first and second epitaxial growth layers formed by selective, epitaxial growth of silicon or silicon-germanium alloy of said first and second doped regions and on a portion of the element isolating and insulating film; and a conformal silicon oxide insulating film formed of a single layer formed by thermal oxidation;

wherein the conformal silicon oxide insulating film is formed directly on and in direct contact with a surface of the first and second epitaxial growth layers and on a surface of the element isolating and insulating film sandwiched between the first and second epitaxial growth layers.

2. The semiconductor device according to claim 1, including first and second transistors having a pair of source/drain regions and a gate electrode, each of the transistors formed at a main surface of a region of said semiconductor substrate with said element isolating and insulating film interposed therebetween, wherein:

said first doped region includes one said source/drain region of said first transistor; and said second doped region includes one said source/drain region of said second transistor.

* * * * *

UNITED STATES PATENT AND TRADEMARK OFFICE
CERTIFICATE OF CORRECTION

PATENT NO. : 6,465,851 B1
DATED : October 15, 2002
INVENTOR(S) : Takumi Nakahata It is certified that error appears in the above-identified patent and that said Letters Patent is hereby corrected as shown below:

Title page,
Item [*] Notice, "Subject to any disclaimer, the term of this patent is extended or adjusted under 35 U.S.C. 154 (b) by 69 days." should read -- Subject to any disclaimer, the term of this patent is extended or adjusted under 35 U.S.C. 154 (b) by 0 days. --

Signed and Sealed this

Nineteenth Day of October, 2004

JON W. DUDAS
*Director of the United States Patent and Trademark Office*